United States Patent
Coté

[11] 3,980,875
[45] Sept. 14, 1976

[54] MULTIPLE FLASH LAMP UNIT

[75] Inventor: Paul T. Coté, Cleveland Heights, Ohio

[73] Assignee: General Electric Company, Schenectady, N.Y.

[22] Filed: July 3, 1974

[21] Appl. No.: 485,422

[52] U.S. Cl. .............................. 240/1.3; 174/68.5; 317/101 CC; 339/17 R
[51] Int. Cl.² ...................................... G03B 15/02
[58] Field of Search ...................... 240/1.3, 103 R; 317/101 CC, 101 DH, 101 F; 339/17 R; 354/126, 127, 148; 431/92, 93, 95 R, 95 A; 174/68.5

[56] References Cited
UNITED STATES PATENTS

| | | | |
|---|---|---|---|
| 3,127,112 | 3/1964 | McCammon et al. | 240/1.3 |
| 3,473,880 | 10/1969 | Wick | 240/1.3 X |
| 3,568,129 | 3/1971 | Gold et al. | 317/101 CC X |
| 3,598,985 | 8/1971 | Harnden et al. | 240/1.3 |
| 3,608,451 | 9/1971 | Kelem | 240/1.3 X |
| 3,619,590 | 11/1971 | Meulemans et al. | 240/1.3 |
| 3,710,704 | 1/1973 | Wagner | 240/1.3 |

*Primary Examiner*—Fred L. Braun
*Attorney, Agent, or Firm*—Norman C. Fulmer; Lawrence R. Kempton; Frank L. Neuhauser

[57] ABSTRACT

A multiple flash lamp unit having a group of electrical connector terminals connected via circuitry to lamps in the unit in a manner so that one terminal and its associated circuitry has relatively more stray capacitance to ground than any of the other terminals and their circuitry. This one terminal is shaped and arranged to be more readily touched than the other terminals when the unit is handled, thus reducing the likelihood of lamps being accidentally flashed by electrostatic charges. Preferably, a large-area shield member is connected to the more readily touchable terminal to increase its stray capacitance to ground.

20 Claims, 3 Drawing Figures

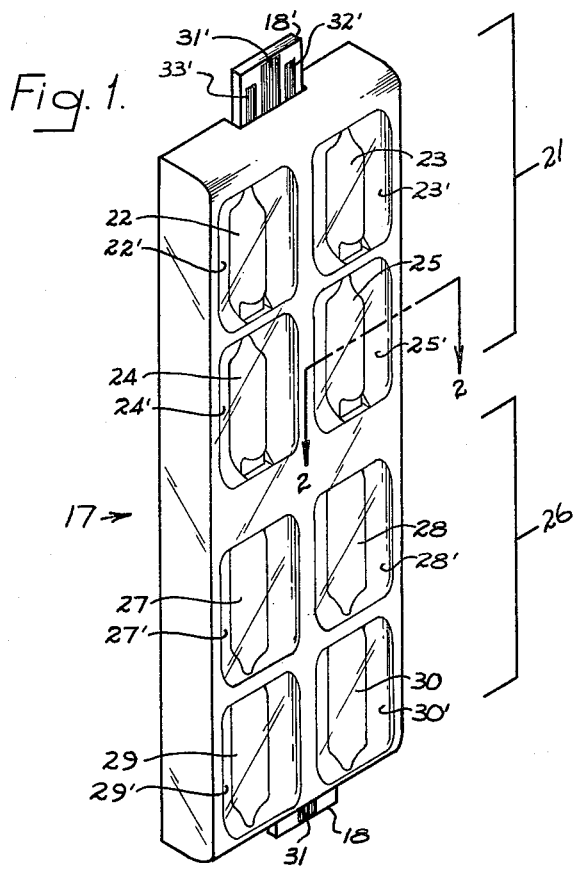
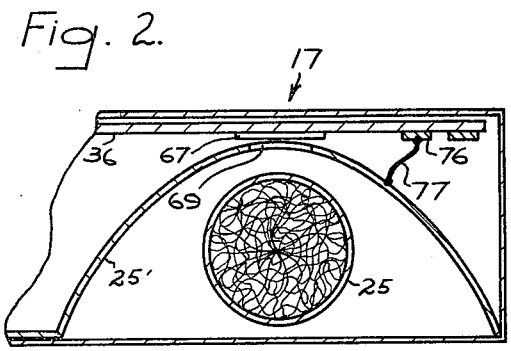
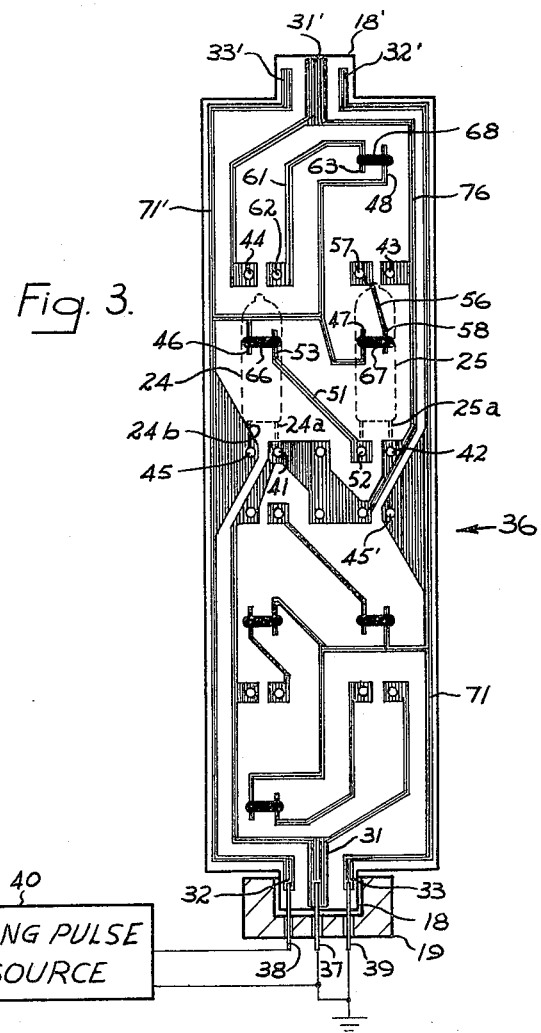

3,980,875

MULTIPLE FLASH LAMP UNIT

CROSS-REFERENCES TO RELATED APPLICATIONS

Ser. No. 448,671, filed Mar. 6, 1974, now U.S. Pat. No. 3,937,946 Kurt H. Weber, "Multiple Flash Lamp Unit", assigned the same as this invention.

Ser. No. 485,459, filed concurrently herewith, Richard Blount, "Multiple Flash Lamp Unit", assigned the same as this invention.

Ser. No. 485,460, filed concurrently herewith, Paul T. Coté, "Protective Terminal for Multiple Flash Lamp Unit", assigned the same as this invention.

BACKGROUND OF THE INVENTION

The invention is in the field of multiple photoflash lamp units, such as flashcubes and planar arrays.

U.S. Pat. Nos. 3,598,984 to Stanley Slomski and 3,598,985 to John Harnden and William Kornrumpf disclose a multiple flash array having first and second groups of flash lamps and reflectors facing in mutually opposite directions. The array is plugged into the camera whereby the first group of lamps faces frontwardly and is connected for the lamps of that group to be flashed. When these lamps have been flashed, the array is turned around and the lamps of the second group face frontwardly and are connected to be flashed. The lamps usually are flashed one at a time; however, a plurality of lamps can be flashed simultaneously if more light is desired.

The above-referenced patent application of Kurt Weber discloses a multiple flash lamp unit that can be connected to a camera in different orientations in each of which a different group of the flash lamps is relatively farther from the camera lens axis than are the other lamps of the unit. The lamps and electrical circuitry are arranged so that in any of the orientations of the unit with respect to the camera, only the group of lamps relatively further from the lens axis can be flashed. The purpose of such an arrangement is to position the "active" group of flash lamps farther above the camera lens, in order to reduce the possibility of a "redeye" effect that causes the pupils of a person's eyes to appear red to pink in flash pictures taken when the flash lamp is close to the camera lens.

The above-referenced Blount patent application discloses a multiple-group of lamp type of flash unit having an additional terminal for causing electrical shorting of the group of lamps that are not to be flashed in each orientation of the unit.

Each of the above-referenced multiple flash lamp units has, in a preferred embodiment, a plug-in connector tab provided with a plurality of electrical connection terminals in the form of conductive stripes printed on or otherwise attached to the connector tab. The various connector terminals are connected to individual lamps or to sequential firing circuitry interconnected with lamps in the unit. Such flash units, and particularly if they employ high voltage types of flash lamps which are flashed by a high voltage pulse (1000 or 2000 volts, for example) of low current energy, are prone to electrostatic firing of one or more lamps if a connection terminal is touched by a person or object having an electrostatic charge. Such undesirable accidental flashing of lamps can also occur if the flash unit housing, which usually is made of a plastic material, acquires an electrostatic charge and a connector terminal is touched. The problem can also occur, and can be more severe, if both the plastic housing and the person or object touching a connection terminal are electrostatically charged with relatively opposite polarities. A similarly severe situation can occur when a person holds the unit at one connector while handing it to another person who grasps it by the other connector, and also when holding the unit at one connector while plugging the other connector into a camera socket.

SUMMARY OF THE INVENTION

Objects of the invention are to provide an improved multiple flash lamp unit; to provide means for preventing accidental electrostatic flashing of lamps in such a unit; and to provide such accidental flash prevention in a manner that is feasible and economical to manufacture.

The invention comprises, briefly and in a preferred embodiment, a multiple flash lamp unit having a group of electrical connector terminals connected via circuitry to lamps in the unit such that one terminal and its associated circuitry has relatively more stray capacitance to ground than any of the other terminals and their circuitry. This one terminal is shaped and arranged to be more readily touched than the other terminals when the unit is handled, thus reducing the likelihood of lamps being accidentally flashed by electrostatic charges. In a preferred embodiment, the more touchable terminal is longer and wider than the other terminals, and is electrically connected in common to a lead-in wire of each of the lamps in the unit and also is connected to a large-area shield member in the unit, to increase its stray capacitance to ground. By thus making one terminal more readily touchable and providing it with a relatively larger stray capacitance to ground, an electrostatic charge applied to this terminal will be principally diverted through the larger stray capacitance to ground instead of passing through flash lamps in the unit.

BRIEF DESCRIPTION OF THE DRAWING

FIG. 1 is a perspective view of a multiple flash lamp unit in accordance with a preferred embodiment of the invention.

FIG. 2 is a cross-sectional view of a portion of FIG. 1, taken on the line 2—2 thereof.

FIG. 3 is a front view of a circuit board to which flash lamps are connected in the multiple lamp unit, shown plugged into a socket.

DESCRIPTION OF THE PREFERRED EMBODIMENT

A multiple flash lamp unit 17, shown as being of the planar array type and containing a plurality of electrically fired flash lamps, is provided with a plug-in connector tab 18 at the lower side or end thereof, adapted to fit into a socket 19 (FIG. 3) of a camera or flash adapter. The lamp array 17 is provided with a second plug-in connector tab 18' at the top side or end thereof, whereby the array 17 is adapted to be attached to the socket 19 in either of two orientations, i.e., with either the tab 18 or the tab 18' plugged into the socket 19. The array 17 is provided with an upper group 21 of flash lamps 22, 23, 24, and 25, and a lower group 26 of flash lamps 27, 28, 29 and 30. Reflectors 22', etc., are disposed behind the respective flash lamps, so that as each lamp is flashed its light is projected forwardly of the array 17. The relationship of each reflector to its associated lamp, and a suitable plastic housing and transparent front cover, may be generally that as is disclosed in the above-referenced planar array patents.

With the array 17 oriented and plugged into the socket 19 as shown in FIG. 3, only the upper four lamps of the array, which constitute the upper group 21, can be flashed, and the four lamps of the lower group 26 are inactive and will not flash. Thus, the above-described undesirable red-eye effect is reduced or eliminated, since the only lamps of the array the can flash are grouped relatively far from the socket 19 and hence from the axis of the camera's lens. The array 17 can be removed from the socket 19, either before or after all lamps of the upper group 21 have been flashed, and turned around, with the upper tab 18' now the lower tab which is inserted into the socket 19, whereupon the group 26 of lamps becomes the upper group, and its lamps are flashed, again reducing or eliminating the red-eye effect because the active lamps are relatively farthest from the socket 19 and hence from the axis of the camera's lens.

Electrical connector terminals are provided at the tabs 18 and 18', and if flash sequencing circuitry is included in the multiple flash unit, for instance as illustrated in FIG. 3, only two electrical terminals, which may be in the form of printed circuit stripes, need be provided on each tab for connecting the upper or active group of lamps to the socket 19. Thus, tab 18 is provided with a pair of electrical terminals 31 and 32, and the tab 18' is provided with a pair of terminals 31' and 32'. Each of the connector tabs 18 and 18' is provided with an additional connector terminal 33 and 33' respectively connected to the circuitry of the lower or inactive group of lamps for shorting the inactive lamp group circuitry when the unit is connected to the socket 19, as is described more fully in the above-referenced Blount patent application.

FIG. 3 shows a circuit board 36 which can be contained within the housing of the unit 17 behind the reflectors 22', etc., and which supports the flash lamps by their lead-in wires and provides for sequential firing of each group of lamps. The plug-in connector tabs 18 and 18' may be formed integrally with the circuit board 36 at opposite ends thereof, as shown. The top and bottom halves of the printed circuitry are reverse mirror images of each other.

The camera socket 19 for the flash unit 17 is provided with a pair of contacts 37 and 38 which respectively electrically engage the terminals 31 and 32 (or 31' and 32') of the flash unit when it is plugged into the socket 19. An additional contact 39 is electrically connected to contact 37, and engages the terminal 33 (or 33') of the flash unit.

A firing pulse source 40, which may be contained within a camera or flash adapter, is connected to the contacts 37 and 38 of the socket 19. The type of firing pulse produced by the source 40 and applied across the contacts 37 and 38 will of course depend on the type of lamps used in the flash unit 17. If low voltage filament types of flash lamps are employed in the unit 17, the firing pulse source 40 may be a battery or battery-capacitor discharge type, producing, in synchronization with opening of the camera shutter, a pulse of approximately 3 to 15 volts or more and of sufficient energy to fire a single flash lamp. An example of a low voltage flash lamp is disclosed in U.S. Pat. No. 3,506,385 to Kurt Weber and George Cressman, and an example of a low voltage flash sequencing circuit is disclosed in U.S. Pat. No. 3,532,931 to Paul Coté and John Harnden. If the flash lamps in the multiple flash unit 17 are of the so-called high voltage type, requiring a pulse of more than 100 volts such as 1000 or 2000 volts or more, the firing pulse source 40 may comprise a suitable battery-capacitor discharge and voltage step-up transformer type of circuit, or may employ a compact piezoelectric element arranged to be impacted or stressed in synchronization with opening of the camera shutter, so as to produce a firing pulse having a voltage of approximately 1000 or 2000 volts or more and of sufficient energy to fire a single flash lamp having a primer between its lead-in wires. An example of a high voltage flash lamp and a firing pulse source comprising a piezoelectric element synchronized with a camera shutter is described in U.S. Patent Nos. 2,972,937 and 3,106,080, both to C. G. Suits.

The circuit board 36 in FIG. 3 is shown in the orientation in which the connector tab 18 faces downwardly and is plugged into the socket 19, whereby the circuit board terminals 31 and 32 respectively make electrical contact with the socket contacts 37 and 38. The circuit board terminal 31 is part of a continuous conductor run on the board, which is connected in common to one electrical lead wire (22a, 23a, 24a, etc.) of each of the eight flash lamps 22, 23, 24, etc., in the unit at points 41, 42, 43, 44, etc., by suitable means such as soldering, welding, or crimping. For the sake of clarity, only two flash lamps 24 and 25 are shown in FIG. 3, and in dashed lines. Suitable openings are provided through the reflectors at the bases of the lamps to permit the connections of the lead-in wires to the circuit board.

The circuit board terminal 32 is part of a conductor run that is connected to lead-in wire 24b of lamp 24 at point 45, and terminates at radiation switch terminals 46, 47, and 48 respectively positioned near lamps 24, 25, and 23. A circuit board conductor run 51 is connected to the remaining lead wire of flash lamp 25 at 52, and terminates at a radiation switch terminal 53 which is near to but spaced from radiation switch terminal 46. A circuit board conductor run 56 is connected to the remaining lead-in wire of flash lamp 23 at point 57, and terminates at a radiation switch terminal 58 which is near to but spaced from radiation switch terminal 47. Similarly, a circuit board conductor run 61 is connected to the remaining lead-in wire of flash lamp 22 at point 62, and terminates at a radiation switch terminal 63 which is near to but spaced from the radiation switch terminal 48.

Radiation switches 66, 67, and 68 are respectively positioned to be in contact with and bridge across the respective pairs of switch terminals 46–53, 47–58, and 48–63. The material for the radiation switches 66, 67, and 68 may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches 66, 67, and 68 is respectively positioned behind and near to a flash lamp 24, 25, 23. Windows in the form of transparent sections or openings 69 may be provided in the reflectors in front of the switches as shown in FIG. 2 to facilitate radiation transfer. A suitable material for the radiation switches 66–68 is silver oxide dispersed in a binder such as polyvinyl resin. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail. It will be noted that the circuit runs from the plugged-in terminals 31 and 32 at the lower part of the circuit board extend upwardly so as to activate the circuitry in the upper half of the circuit board. Similarly, when the unit is turned around and tab 18' is plugged into the socket 16, the circuit board terminals 31' and 32' will be connected to and activate the lamps which then will be in the upper half of the circuit board, and hence in the upper half of the flash unit 17. This accomplishes, as has been stated, the desirable characteristic whereby only the group of lamps relatively farthest away from the lens axis will be flashed, thereby reducing or eliminating the undesirable red-eye effect.

The additional terminal 33 on the plug-in tab 18 is connected, via printed circuit run 71, to the connection point 45' for lamp 28, which is the first lamp to be flashed when the array is turned around so that terminals 31' and 32' are connected to the firing pulse source 40 via the socket 19. Since the socket contactors 37 and 39 are electrically shorted together, they electrically short together the tab terminals 31 and 33, also at the same time shorting terminals 31' and 32' of the inactive lower group of lamps, thus electrically shorting the input of the circuitry for the inactive group of lamps. Similarly, when the unit is turned around, the socket contactors 37 and 39 will electrically short the terminals 31' and 33' and also terminals 31 and 32, thus shorting the input of the then inactive lamp circuit. This shorting of the inactive lamp circuit prevents accidental flashing of an inactive lamp by stray capacitive coupling of a firing pulse. Of course, this precaution is useful only when the inactive lamps have not yet been flashed, and is not necessary if they have already been flashed.

The circuit of FIG. 3 functions as follows. Assuming that none of the four lamps in the upper half of the unit 17 have been flashed, upon occurrence of a first firing pulse from the source 40, this pulse will be directly applied to the lead-in wires of the first lamp 24, whereupon the lamp 24 flashes and becomes an open circuit between its lead-in wires. Heat and/or light radiation from the flashing first lamp 24 causes the adjacent radiation switch 66 to become a closed circuit between terminals 46 and 53 (or a low value of resistance), thereby connecting the circuit board terminal 32 electrically to the lead-in wire of the second lamp 25 at point 52. By the time this occurs, the firing pulse has diminished to a value insufficient to cause the second lamp 25 to flash. When the next firing pulse occurs, it is applied to the lead-in wires of the second lamp 25, via the now closed radiation switch 66, whereupon the second lamp 25 flashes, thereby causing radiation switch 67 to assume zero or low resistance, and the second lamp 25 now has an open circuit or high resistance between its lead-in wires. When the next firing pulse occurs, it is applied via now closed radiation switch 67 to the third lamp 23 via its lead-in wires which are connected to the printed circuit at points 43 and 57, thereby firing the lamp which becomes an open circuit, and the radiation from it causes the radiation switch 68 to become essentially a closed circuit across its terminals. Thus, the next firing pulse will be applied, via now closed radiation switch 68, to the lead-in wires of the fourth flash lamp 22 which are connected to the circuit at points 44 and 62, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around and the other connector tab 18' attached to the socket 16, the group of lamps that then become uppermost and relatively farthest away from the lens axis will be in an active circuit and will be flashed in the same manner as has been described.

The embodiment thus far described is similar to that disclosed in the above-referenced Blount patent application.

In accordance with the invention, the groups of connector terminals 31, 32, 33 and 31', 32', 33' are shaped and arranged so that when touched by a person or object it will be likely that the terminal 31 (or 31'), which is connected in common to a lead-in wire of each of the flash lamps, will be touched instead of or in addition to the other terminals. This is achieved, in a preferred embodiment, by making the terminal 31 (and 31') longer than the other terminals so that it extends closer to the end of the tab 18 (or 18') than do the other terminals. Also, the terminal 31 (and 31') is made wider than the other terminals to increase its likelihood of being touched instead of or in addition to the other terminals when the unit is handled.

The common terminals 31 and 31', being connected to a lead-in wire of each of the flash lamps in the unit, will have a relatively greater value of stray capacitance to ground than any of the other terminals. When this more readily touchable common circuit terminal is touched by an electrostatically charged person or object, substantially all of the charge energy will be dissipated to ground through the relatively larger capacitance of the common connection circuit rather than passing through the primer of a lamp and hence through the relatively smaller capacitance of the remaining circuitry to ground. If the charged person or object touched only the terminal 32 (or 33') or only the terminal 33 (or 32'), the dissipative flow would tend to pass through one or more of the lamp primers, creating a spurious electrostatic firing of the lamp or lamps. But since the common connector terminal (i.e., the terminal 31 or 31') is substantially always touched alone or simultaneously with one of the terminals 32, 33, 32' or 33', the electrostatic charge will pass to ground through the relatively larger capacitance of the common connection circuit without tending to flow through a lamp primer.

Simultaneous touching of the common terminal 31 or 31' and one or both of the remaining terminals cannot cause electrostatic flashing because the same voltage is applied to both lead-in wires of the lamps. Usually, if the electrostatic charge is great enough to be likely to flash a lamp, contact will be in the form of a spark between the common terminal 31 or 31' and the electrostatically charged finger or object. Since the common terminals 31 and 31' are connected electrically together and are more likely to be touched than the other terminals, there is reduced likelihood of accidental electrostatic flashing of lamps when a person holds the unit at one connector tab while handing it to another person who grasps it by the other connector tab, or when holding the unit at one connector tab while plugging the other connector tab into a camera socket provided the socket contacts are arranged, such as shown in FIG. 3, so that the common terminal 31 engages with the common contact 37 first and before any other terminal-to-contact engagements. With this construction, it is unlikely that a common terminal and one of the other terminals can be touched simultaneously by persons or objects having differing electrical potentials that will accidentally flash a lamp.

To increase the stray capacitance to ground of the common connection circuit, and therefore further reduce the likelihood of accidental electrostatic firing of lamps, a large-area shield member is connected to the common connection circuit. An advantageous way of achieving this is to provide a one-piece multiple reflector unit, of substantially the same size as the flash unit 17, shaped to provide the individual reflectors 22', 23', etc., and made of metal or metal-coated plastic and connected electrically to the common connection circuit 76 by means such as a wire 77 (FIG. 2).

It has been found that the invention achieves its objectives of reducing the likelihood of accidental electrostatic flashing of lamps in a multiple lamp flash unit, and achieves this in a manner that is feasible and economical to manufacture.

While a preferred embodiment of the invention has been shown and described, various other embodiments and modifications thereof will become apparent to persons skilled in the art, and will fall within the scope of the invention as defined in the following claims; for example, the invention can have various geometries and be embodied in the form of stacked double-decked flashcubes, and can be applied to other planar array configurations, such as dual-sided arrays, and to multiple flash lamp units which may have more than the two operable orientations that have been specifically described. The term "camera" as used herein is intended to include a flash adapter device for a camera.

What I claim as new and desire to secure by Letters Patent of the United States is:

1. A circuit board for a planar flash array, comprising an elongated circuit board member having first and second integral tabs extending at the ends thereof, each of said tabs having a free end spaced from the remainder of the circuit board, a first group of pairs of flash lamp connection areas carried on said circuit board member on a first half thereof that is nearest said first connector tab, a second group of pairs of flash lamp connection areas carried on said circuit board member on a second half thereof that is nearest said second connector tab, three circuit runs carried on said circuit board member, first end portions of the circuit runs being adjacent one another and forming three connector terminals arranged in a row across said first tab, second end portions of the circuit runs being adjacent one another and forming three connector terminals arranged in a row across said second tab, the terminals formed by a first of said circuit runs being positioned between the terminals formed by the second and third of said circuit runs and extending nearer to said ends of the tabs than the terminals formed by the second and third of said circuit runs, said first circuit run being connected electrically with one lamp connection area of each said pair thereof, the second and third of said circuit runs being respectively connected electrically with the remaining lamp connection areas of said first and second groups of pairs of lamp connection areas.

2. A circuit board as claimed in claim 1, in which each of said terminals formed by the first circuit run is wider than said terminals formed by the second and third circuit runs.

3. A circuit board as claimed in claim 2, in combination with an electrically conductive reflector member, and means electrically connecting said reflector member to said first circuit run.

4. A multiple flash lamp unit comprising a group of photoflash lamps of the electrically fired type and each having two lead-in conductors, said unit including a connector tab having a free end, first and second electrical terminal portions extending along one surface of said tab toward the free end thereof, and circuitry connected between said terminal portions and said lead-in conductors of the lamps, the circuitry connected to said first terminal portion having relatively larger stray capacitance to ground than the circuitry connected to said second terminal portion, said first terminal portion extending closer to said free end of the tab than said second terminal portion so as to be more readily touched than said second terminal portion when the unit is handled thereby to render it difficult to touch said second terminal portion without also touching said first terminal portion when said one surface of said tab is touched adjacent said free end.

5. A unit as claimed in claim 4, further including a second group of photoflash lamps of the electrically fired type and each having two lead-in conductors, said circuitry connecting said first terminal portion to one lead-in conductor of each lamp of said second group of lamps, a third terminal portion extending along said one surface of said tab toward the free end thereof, additional circuitry connecting said third terminal portion to the other lead-in conductor of each lamp of said second group of lamps and having relatively smaller stray capacitance to ground than the circuitry connected to said first terminal portion, said first terminal portion being located between said second and third terminal portions and extending closer to the free end of said tab than said second and third terminal portions.

6. A multiple flash lamp unit comprising a plurality of photoflash lamps of the electrically fired type having lead-in conductors, said unit including a connector having a substantially flat surface thereon terminating at an end thereof spaced from the remainder of the unit, a group of electrical connector terminals for connection to a source of firing pulses, said terminals extending along said surface of the connector toward said end thereof, and circuitry connected between said terminals and said lead-in conductors of the lamps, said circuitry connected to a first one of the terminals having relatively more stray capacitance to ground than that connected to the other terminals of said group, said first terminal extending closer to said end of the connector than do the other of said terminals so as to be more readily touched than the other terminals when the unit is handled whereby any electrostatic charge applied to said first terminal will tend to become dissipated to ground via said relatively more stray capacitance rather than causing any of said lamps to flash.

7. A unit as claimed in claim 6, in which said circuitry connected to said first terminal electrically connects a lead-in conductor of each of said lamps to said first terminal.

8. A unit as claimed in claim 7, in which a second one of said terminals is connected to another lead-in conductor of at least some of said lamps by means of sequential switching circuitry for causing different lamps to be flashed by different firing pulses.

9. A unit as claimed in claim 6, including a conductive shield member connected electrically to said first terminal.

10. A unit as claimed in claim 6, comprising a main body housing portion, said connector extending from said main body housing portion, said group of terminals extending from the main body housing portion along said surface of said connector and toward said end thereof.

11. A unit as claimed in claim 10, in which said terminals are in the form of metal stripes on said surface of the connector, said first terminal being wider than any other terminal of said group thereof.

12. A unit as claimed in claim 10 of the type in which said connector extends from a first end of said main body housing portion and at least two of the terminals thereon are associated with a first group of said lamps positioned toward a second end of the main body housing portion, and including a second connector extending from said second end of the main body housing portion and having a group of terminals thereon, at least two terminals of the last-named group thereof being associated with a second group of said lamps positioned toward the first end of the main body housing portion, said circuitry including first and second sequencing circuits respectively connected with said first and second groups of lamps, said groups of terminals being similarly arranged on the two connectors, a first terminal on said first connector and a first terminal on said second connector being connected electrically to one another and to both groups of lamps, and a second terminal on said first connector and a second terminal on said second connector being connected electrically to said first and second sequencing circuits, respectively.

13. A unit as claimed in claim 12, including an electrically conductive reflector member shaped to provide individual reflectors for said lamps, and means electrically connecting said reflector member to said first terminals.

14. A unit as claimed in claim 12, in combination with a socket adapted to receive said first and second connectors one at a time, said socket being provided with a pair of contact members adapted to respectively contact the first and second terminals of whichever connector is received by the socket, said contact members being arranged so that said first terminal is the first to be contacted by a contact member while the socket is receiving the connector.

15. A unit as claimed in claim 10 of the type in which said connector extends from a first end of said main body housing portion and at least two of the terminals thereon are associated with a first group of said lamps positioned toward a second end of the main body housing portion, and including a second connector extending from said second end of the main body housing portion and having a group of terminals thereon, at least two terminals of the last-named group thereof being associated with a second group of said lamps positioned toward the first end of the main body housing portion, said circuitry including first and second sequencing circuits respectively connected with said first and second groups of lamps, said groups of terminals being similarly arranged on the two connectors and each comprising three terminals of which said first terminal is flanked by second and third terminals, said first terminals of the two groups thereof being electrically connected together and to both of said groups of lamps, said second terminal of each group thereof being electrically connected to the third terminal of the other group thereof, and said interconnected second and third terminals being respectively connected electrically to said first and second sequencing circuits.

16. A unit as claimed in claim 15, including an electrically conductive reflector member shaped to provide individual reflectors for said lamps, and means electrically connecting said reflector member to said first terminals.

17. A unit as claimed in claim 15, in combination with a socket adapted to receive said first and second connectors one at a time, said socket being provided with first, second, and third contact members adapted to respectively contact the first, second, and third terminals of the connector received by the socket, and means connecting said first and third contact members electrically together, said contact members being arranged so that said first terminal is the first to be contacted by a contact member while the socket is receiving the connector.

18. A unit as claimed in claim 6, comprising a main body portion having a substantially flat surface thereon bounded by edges, said connector extending from said surface of the main body portion with said end thereof spaced from said surface of the main body portion, said terminals extending from the main body portion away from said surface thereof and along said surface of said connector toward said end thereof, said surface of the connector being positioned so as to face toward and be spaced from one of said edges of the body portion.

19. A multiple flash lamp unit comprising a plurality of photoflash lamps of the electrically fired type having lead-in conductors, said unit including a connector having an end thereof spaced from the remainder of the unit, a group of electrical connector terminals for connection to a source of firing pulses, said terminals extending along a surface of said connector toward said end thereof, and circuitry connected between said terminals and said lead-in conductors of the lamps, said circuitry connected to a first one of the terminals having relatively more stray capacitance to ground than that connected to the other terminals of said group, said first terminal extending closer to said end of the connector than do the other of said terminals so as to be more readily touched than the other terminals when the unit is handled, said flash unit including an electrically conductive reflector member shaped to provide individual reflectors for said lamps, and means electrically connecting said reflector member to said first terminal.

20. A unit as claimed in claim 19, in which said first terminal is connected electrically to a lead-in conductor of each of said lamps.

* * * * *